(12) United States Patent
Asadi et al.

(10) Patent No.: US 10,094,537 B2
(45) Date of Patent: Oct. 9, 2018

(54) COLOR CONVERSION ARRANGEMENT, A LIGHTING UNIT, A SOLID STATE LIGHT EMITTER PACKAGE AND A LUMINAIRE

(71) Applicant: PHILIPS LIGHTING HOLDING B.V., Eindhoven (NL)

(72) Inventors: Kamal Asadi, Eindhoven (NL); Dagobert Michel De Leeuw, Eindhoven (NL); Johannes Franciscus Maria Cillessen, Deurne (NL); Manuela Lunz, Waalre (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 260 days.

(21) Appl. No.: 14/649,328

(22) PCT Filed: Dec. 2, 2013

(86) PCT No.: PCT/IB2013/060561
§ 371 (c)(1),
(2) Date: Jun. 3, 2015

(87) PCT Pub. No.: WO2014/087318
PCT Pub. Date: Jun. 12, 2014

(65) Prior Publication Data
US 2015/0345745 A1    Dec. 3, 2015

Related U.S. Application Data

(60) Provisional application No. 61/733,510, filed on Dec. 5, 2012.

(51) Int. Cl.
*F21V 33/00* (2006.01)
*F21V 9/16* (2006.01)
(Continued)

(52) U.S. Cl.
CPC ............ *F21V 9/16* (2013.01); *F21V 9/30* (2018.02); *F21V 29/70* (2015.01); *H01L 33/502* (2013.01);
(Continued)

(58) Field of Classification Search
CPC .......... F21V 9/16; F21V 29/70; H01L 33/502; H01L 33/641; H01L 33/644; H01L 33/50; H01L 2924/0002
(Continued)

(56) References Cited

U.S. PATENT DOCUMENTS

2010/0085713 A1    4/2010 Balandin
2011/0042709 A1    2/2011 Stark et al.
(Continued)

FOREIGN PATENT DOCUMENTS

CN    102386296 A    3/2012
JP    2012074703 A    4/2012
(Continued)

*Primary Examiner* — Elmito Breval
*Assistant Examiner* — Jessica M Apenteng
(74) *Attorney, Agent, or Firm* — Akarsh P. Belagodu

(57) ABSTRACT

The invention provides a color conversion arrangement, a lighting unit, a solid state light emitter package, a luminaire and a specific use of a graphene layer. A color conversion arrangement (140) with the first aspect comprises a first luminescent layer (110), a supporting layer (106) and a first graphene layer (108). The color conversion arrangement (140) is for converting light of a first color to light of another color. The first luminescent layer (110) comprises a first luminescent material which absorbs a portion of light of a first spectral distribution comprising the first color and converts at least a portion of the absorbed light towards light of a second spectral distribution. The supporting layer (106) supports the luminescent layer (110). The first graphene layer (108) thermally conducts heat in a lateral direction
(Continued)

such that temperature differences in the color conversion arrangement (140) are reduced. Different arrangements of the layers of the color conversion arrangement (140) are provided.

12 Claims, 5 Drawing Sheets

(51) Int. Cl.
*F21V 29/70* (2015.01)
*H01L 33/50* (2010.01)
*H01L 33/64* (2010.01)
*F21V 9/30* (2018.01)

(52) U.S. Cl.
CPC .......... *H01L 33/641* (2013.01); *H01L 33/644* (2013.01); *H01L 33/50* (2013.01); *H01L 2924/0002* (2013.01)

(58) Field of Classification Search
USPC .......................... 362/84, 230–235, 294, 373
See application file for complete search history.

(56) References Cited

U.S. PATENT DOCUMENTS

| | | | |
|---|---|---|---|
| 2011/0133236 A1* | 6/2011 | Nozaki | H01L 33/642 257/98 |
| 2012/0069547 A1* | 3/2012 | Gielen | F21K 9/54 362/84 |
| 2012/0133263 A1 | 5/2012 | Yang et al. | |
| 2012/0156436 A1 | 6/2012 | Kim et al. | |
| 2012/0274882 A1* | 11/2012 | Jung | G02F 1/133617 349/96 |

FOREIGN PATENT DOCUMENTS

| | | |
|---|---|---|
| KR | 20120029269 A | 3/2012 |
| KR | 20120059061 A | 6/2012 |
| KR | 20120131009 A | 12/2012 |
| WO | 2010002708 A1 | 1/2010 |
| WO | 2012111893 A1 | 8/2012 |

* cited by examiner

COLOR CONVERSION ARRANGEMENT, A LIGHTING UNIT, A SOLID STATE LIGHT EMITTER PACKAGE AND A LUMINAIRE

CROSS-REFERENCE TO PRIOR APPLICATIONS

This application is the U.S. National Phase application under 35 U.S.C. § 371 of International Application No. PCT/IB13/060561, filed on Dec. 2, 2013, which claims the benefit of U.S. Provisional Patent Application No. 61/733,510, filed on Dec. 5, 2012. These applications are hereby incorporated by reference herein.

FIELD OF THE INVENTION

The invention relates to color conversion arrangements that comprise a luminescent material for converting light of a first color to light of a second color. The invention further relates to a lighting unit, to a solid state light emitter package, a luminaire and to the use of a graphene layer.

BACKGROUND OF THE INVENTION

In a luminescent material, light of a first spectral distribution is absorbed and is partially converted towards light of a second spectral distribution. Not all absorbed energy is emitted in the form of light. Some energy is converted towards heat because of the Stokes shift of the luminescent material. The Stokes shift is the difference between the positions of the absorption spectral distribution and the emission spectral distribution. Absorbed photons are emitted as photons with a lower amount of energy and the non-emitted energy is transformed into heat.

When the temperature of the luminescent material becomes too high, the operation of the luminescent material is negatively influenced and in certain cases the luminescent material may deteriorate or may be destroyed. When luminescent materials become too warm, their conversion efficiency significantly drops, their light emission spectrum may change, and their life-time is reduced because of deterioration and/or destruction of the luminescent material. Furthermore, if the luminescent material becomes hot, the material in which the luminescent material is dispersed or dissolved, or the material on which the luminescent material is provided, must also be heat resistant and may be subject to deterioration and/or destruction.

Luminescent materials are often applied in a layer and the light which impinges on the layer is often not homogeneously spread over the whole layer. Therefore, in most case, there is a temperature gradient in the layer with luminescent material. Temperature gradients have the additional disadvantage of the generation of stress in the materials which are subject to the temperature gradient.

Published patent application WO2010/002708A1 relates to a light emitting device which comprises a phosphor layer which converts light from a first color towards light of another color. The phosphor layer is provided on top of a recessed housing and the recess comprises a light emitting semiconductor which emits light of the first color to the phosphor layer. Only a portion of the phosphor layer is illuminated with light of the first color and as the result of the Stokes Shift, this portion of the phosphor layer becomes relatively hot. The phosphor layer may also be in contact with a transparent layer and the combination of the phosphor layer and the transparent layer will locally become relatively hot during operation of the light emitting device. In the cited patent application the recessed housing is made of a thermal conductive material which is capable of conducting the heat away from the phosphor layer and/or the transparent layer.

Although the light emitting device of the cited patent application provides means for cooling the phosphor layer, there is, during operating, still a too large temperature gradient present within the phosphor layer and/or the transparent layer with which the phosphor layer is in contact. For example, the transparent layer should decrease temperature difference within the phosphor layer, however, heat transfer from the phosphor layer to the transparent layer is not efficient and the transparent layer itself does not conduct enough heat towards the housing.

SUMMARY OF THE INVENTION

It is an object of the invention to provide a color conversion arrangement which reduces temperature differences within the color conversion arrangement.

A first aspect of the invention provides a color conversion arrangement. A second aspect of the invention provides a lighting unit. A third aspect of the invention provides a solid state light emitter package. A fourth aspect of the invention provides a luminaire. A fifth aspect of the invention relates to the use of a graphene layer Advantageous embodiments are defined in the dependent claims.

A color conversion arrangement in accordance with the first aspect of the invention comprises a first luminescent layer, a supporting layer and a first graphene layer. The color conversion arrangement is for converting light of a first color to light of another color. The first luminescent layer comprises a first luminescent material which absorbs a portion of light of a first spectral distribution comprising the first color and converts at least a portion of the absorbed light towards light of a second spectral distribution. The supporting layer supports the luminescent layer. The first graphene layer thermally conducts heat in a lateral direction such that temperature differences in the color conversion arrangement are reduced. In a first optional arrangement of the layers, the supporting layer is formed by a layer of a solid state light emitter and a stack of the luminescent layer and the graphene layer is provided on the layer of the solid state light emitter. A light emitting surface of the layer of the solid state light emitter is in contact with either the luminescent layer or the graphene layer. In a second optional arrangement of the layers, the supporting layer comprises a first side and a second side being opposite the first side and the first graphene layer is provided at the first side of the supporting layer and the luminescent layer is provided at the second side. The graphene layer is thermally coupled to the supporting layer and the first luminescent layer is thermally coupled to the supporting layer. In a third optional arrangement of the layers, the color conversion arrangement comprises a second graphene layer and the first luminescent layer is sandwiched between the first graphene layer and the second graphene layer. A stack of the graphene layers and first luminescent layer is provided on the supporting layer. In a fourth optional arrangement of the layers, the color conversion arrangement comprises second luminescent layer comprising a second luminescent material. The first graphene layer is sandwiched between the first luminescent layer and the second luminescent layer and a stack of the luminescent layers and the first graphene layer is provided on the supporting layer. The second luminescent material absorbs a portion of light of a third spectral distribution comprising the first color and/or light of the second spectral distribution and converts at least a portion of the absorbed light towards light of a fourth spectral distribution.

In the color conversion arrangement at least one graphene layer is in direct contact with the first luminescent layer or one graphene layer is provided at a specific position at which it is thermally coupled to the first luminescent layer via the supporting layer. Thus, the graphene layer receives heat which is generated in the first luminescent layer. Graphene is very well capable of conducting heat and, consequently, the at least one graphene layer conducts heat from warmer volumes of the color conversion arrangement to colder volumes of the color conversion arrangement thereby reducing the temperature differences in the color conversion arrangement as a whole. Thus, the peak temperature of the luminescent layer is reduced and other areas of the color conversion arrangement become, within acceptable limits, warmer. Thereby the disadvantageous effects of too hot luminescent material are reduced—hence, the luminescent material has a longer life time, has a relative high conversion efficiency, shall be subject to less deterioration, and changes in the emission spectrum shall be reduced. Additionally, the temperature of the supporting layer shall not become as high as in a color conversion arrangement without the first graphene layer, and the temperature gradient in the supporting layer will show lower temperature differences. Thus, the supporting layer does not have to withstand these large temperature differences and may, optionally, be manufactured of a less expensive material.

Graphene is a material which comprises a single layer of carbon atoms in an atomic scale honeycomb lattice, or which comprises 2 to 9 of such single layers of carbon atoms in an atomic scale honeycomb lattice. Above 9 layers of the carbons atoms in the honeycomb lattice the characteristics of the material significantly changes and the material is termed "graphite". In the context of this invention, it is relevant whether graphene is thermally conductive and is light transmitting (which means that a significant portion of light which impinges on the material is transmitted through the material) and, thus, graphene may have 1 to 9 layers of carbon atoms in an atomic scale honeycomb lattice. Single layer graphene absorbs about 2.3% of visible light. In an embodiment, the graphene layer has less than 5 layers of carbon atoms in an atomic scale honeycomb lattice.

The supporting layer may be a separate layer in the color conversion arrangement, but may also be a layer of another device. The function of the supporting layer is to support at least the first luminescent layer (which is, in specific embodiments, not capable of carrying its own weight) and/or the second luminescent layer and possibly supporting the first and/or second graphene layer. In specific embodiments, the supporting layer is a substrate layer or another layer (for example, the die of the solid state light emitter) of a solid state light emitter (such as, for example, a Light Emitting Diode) and in such a specific embodiment, the graphene layer also reduces temperature differences within the light emitter packages which comprises the solid state light emitter and the color conversion arrangement. In practical embodiments, the supporting layer is light transmitting. In another practical embodiment, the supporting layer has a relatively low thermal conductivity, for example, larger than 0.1 W/(m·K), or, in another optional embodiment, larger than 1 W/(m·K).

In the sections above and in this application the term "light transmitting" is used to indicate that light is transmittable through the light transmitting material. Thus, if light impinges on the material, at least some light is transmitted through the material (and, thus, leaves the material at a specific surface of the material). It is not necessary that all light is transmitted through the material, and some light may be absorbed (for example, less than 10% of the impinging light, or less than 3% of the impinging light) and/or some impinging light may be reflected (for example, less than 25% of the impinging light, or less than 10% of the impinging light). The light may be scattered within the light transmitting material. The term light transmitting comprises the terms "transparent" and "translucent".

In the above sections and in this application, the term "thermally coupled" is used to indicate that a first material has a direct or indirect heat transfer path with a second material. In other words, energy in the form of heat may be transferred from the first material to the second material and vice versa. The first material may be in direct contact with the second material, but other materials may also be provided in between the first and second material as long as the other materials are no heat isolators. For example, a heat conducting path may be provided between the first and the second material if the first and second materials are in direct contact with each other, or the first material may be glued to the second material by means of a relatively thin layer of glue. Furthermore, if in this application two layers are provided on top of each other and/or are in direct contact with each other, it implicitly also discloses that these two layers are thermally coupled to each other.

The second luminescent material may be configured to absorb light of the third spectral distribution comprising the first color. This means that the third spectral distribution may have some overlap with the first spectral distribution. In an embodiment, the third spectral distribution is substantially equal to the first spectral distribution.

Optionally, the color conversion arrangement comprises a heat transfer interface for being thermally coupled to a heat sink, wherein the first graphene layer and optionally the optional second graphene layer are thermally coupled to the heat transfer interface. Thus, the first graphene layer and the optional second graphene layer do not only contribute to the reduction of temperature differences within the color conversion arrangement, they also contribute to the effective transfer of heat towards a heat sink. The first graphene layer and the optional second graphene layer are almost transparent and have a high thermal conductivity and, thus, they contribute to the effect that the luminescent material does not become too hot while the efficiency of the color conversion arrangement does not significantly reduce.

Optionally, the first luminescent material and optionally the optional second luminescent material comprise at least a luminescent material selected from the group of inorganic phosphors, organic phosphors and particles showing quantum confinement and that have at least in one dimension a size in the nanometer range.

The inorganic luminescent material may comprise a yellow or yellow/green emitting inorganic phosphor, such as YAG and/or LuAG, or a red inorganic phosphor such as ECAS and/or BSSN.

Organic phosphors have a high quantum efficiency and are often transparent, which prevents undesired scattering and increases efficiency. Organic luminescent materials have more advantages. The position and the bandwidth of the luminescence spectrum can be designed with ease to be anywhere in the visible range. As such it is relatively easy to manufacture a light source which emits white light with high efficacy. The white light may be a combination of at least two colors of light, and, thus, the light source may comprise a single light emitter that emits light of a first color and comprise at least one organic luminescent material that converts a part of the light of the first color into a light of a second color. The organic phosphor may be a material which comprises a perylene derivative, such as a yellow emitting perylene derivative, or a red/orange emitting perylene derivate. Such perylene derivatives are commercially available under the name Lumogen Yellow F083 or F170, Lumogen Red F305 and Lumogen Orange F240.

Particles showing quantum confinement and having at least in one dimension a size in the nanometer range are, for example, quantum dots, quantum rods or quantum tetrapods. Having a size in one dimension in the nanometer range means that, for example, if the particles are substantially spherical, their diameter is in the nanometer range. Or, this means, for example, if they are wire-shaped, that a size of a cross-section of the wire is in one direction in the nanometer range. A size in the nanometer range means that their size is at least smaller than 1 micrometer (for example, smaller than 500 nanometers) and larger or equal to 0.5 nanometer. In an embodiment, the size in one dimension is smaller than 50 nanometers. In another embodiment the size in one dimension is in the range from 2 to 30 nanometers. Quantum dots are small crystals of semiconducting material generally having a width or diameter of only a few nanometers. When excited by incident light, a quantum dot emits light of a color determined by the size and material of the crystal. Light of a particular color can, therefore, be produced by adapting the size of the dots.

It is to be noted that in this document the luminescent material(s) convert at least a portion of the absorbed light towards light in their light emission spectrum. Often not all light is converted into emitted light because of conversion inefficiencies, resulting in the generation of heat. However, advantageous luminescent materials convert almost all absorbed energy into light in the light emission spectrum.

Optionally, if the color conversion arrangement comprises a second graphene layer and the first luminescent layer is sandwiched between the first graphene layer and the second graphene layer and a stack of the graphene layers and first luminescent layer is provided on the supporting layer, or if the color conversion arrangement comprises second luminescent layer comprising a second luminescent material being configured for absorbing a portion of light of a third spectral distribution comprising the first color and/or light of the second spectral distribution and being configured for converting at least a portion of the absorbed light towards light of a fourth spectral distribution, the first graphene layer is sandwiched between the first luminescent layer and the second luminescent layer and a stack of the luminescent layers and the first graphene layer is provided on the supporting layer, the color conversion arrangement comprises another second graphene layer which is provided on an opposite surface of the supporting layer, wherein the opposite surface is a surface of the supporting layer being opposite the surface on which one of the respective stacks is provided.

According to these optional embodiments, additional graphene layers are provided such that temperature differences can be better reduced in the color conversion arrangement and such that, if an interface to a heat sink is provided, the heat can be better conducted away to the heat sink.

Optionally, if the supporting layer comprises a first side and a second side being opposite the first side, the first graphene layer is provided at the first side of the supporting layer and the graphene layer is thermally coupled to the supporting layer, the first luminescent layer is provided at the second side of the supporting layer and the first luminescent layer is thermally coupled to the supporting layer, or if the color conversion arrangement comprises second luminescent layer comprising a second luminescent material being configured for absorbing a portion of light of a third spectral distribution comprising the first color and/or light of the second spectral distribution and being configured for converting a portion of the absorbed light towards light of a fourth spectral distribution, the first graphene layer is sandwiched between the first luminescent layer and the second luminescent layer and a stack of the luminescent layers and the first graphene layer is provided on the supporting layer, the conversion arrangement comprises a further second graphene layer which is provided, respectively, on a surface of the first luminescent layer or on a surface of the second luminescent material which is facing away from the supporting layer.

According to these optional embodiments, additional graphene layers are provided such that temperature differences can be better reduced in the color conversion arrangement and such that, if an interface to a heat sink is provided, the heat can be better conducted away to the heat sink.

According to a second aspect of the invention a lighting unit is provided which comprises a housing, a light emitter and a color conversion arrangement according to any one of the previously discussed embodiments. The housing encloses a cavity and the housing comprises a light exit window. At least a portion of the housing is of a heat conductive material. The light emitter is provided in the cavity and is configured to emit light of the first color. The color conversion arrangement is provided at the light exit window. The first graphene layer and/or one of the optional second graphene layer, the optional another second graphene layer and the optional further second graphene layer is thermally coupled to the portion of the housing of the heat conductive material.

The lighting unit according to the second aspect comprises the color conversion arrangement which has advantages as discussed before. Additionally, the housing is at least partly made of a heat conductive material and at least one of the graphene layers is capable of conducting heat generated in the luminescent layer towards the housing. Thereby the housing itself acts as a heat sink. In other words, within the lighting unit as a whole there may be significant temperature differences, such as for example a temperature difference between the color conversion arrangement and the housing, and because of the thermal coupling between the portion of the housing and at least one of the graphene layers the temperature differences within the lighting unit as a whole are also reduced. Thus, the temperature of the color conversion arrangement is further reduced leading to a larger extent to the earlier discussed advantages which are related to such a temperature reduction.

It is to be noted that any type of light emitter may be used which is capable of emitting light of the first color. In a specific embodiment, the light emitter is a solid state light emitter. The solid state light emitter may be one of the types of solid state light emitters which is discussed in this application, such as an Organic Light Emitting Diode, a Light Emitting Diode, or, for example, a laser diode.

Optionally, when the color conversion arrangement has a heat transfer interface as discussed in one of the previous optional embodiments, the heat transfer interface is in contact with the portion of the housing of the heat conductive material. Consequently, in this optional embodiment, the heat generated in the color conversion arrangement is better transferred to the heat conductive portion of the housing.

Optionally, the lighting unit comprises an additional graphene layer being arranged at a surface of the housing which faces the cavity. The additional graphene layer is thermally coupled to the light emitter and/or to the heat conductive portion of the housing. The additional graphene layer provides additional means to reduce temperature differences within the lighting unit as a whole. In this optional embodiment, the additional graphene layer substantially contributes to the cooling of the light emitter.

Optionally, the lighting unit comprises a heat sink and the heat conductive portion of the housing is thermally coupled to the heat sink. Thus, the heat conductive portion of the housing is capable of transferring heat from the color conversion arrangement towards the heat sink such that the temperature of the color conversion arrangement is kept within acceptable limits.

According to a third aspect of the invention, a solid state light emitter package is provided which comprises a solid state light emitter die and a color conversion arrangement according to one of the previously discussed embodiments. The solid state light emitter die is arranged on a substrate and the substrate may also function as the supporting layer of the color conversion arrangement. In specific embodiments, the solid state light emitter does not have a substrate layer through which light is emitted and in such an embodiment, another layer of the solid state light emitter may act as a supporting layer. The solid state light emitter package has as an advantage that the temperature differences are reduced within the solid state light emitter package by the first graphene layer of the color conversion arrangements. Reduced temperature differences lead to less stress within the material subject to the temperature differences and it also means that the highest temperature is reduced such that specific material are to a lesser extent subject to deterioration and or destruction by heat. It is to be noted that the color conversion arrangement is arranged on a light emitting surface of the solid state light emitter die or the light emitted by the solid state light emitter is emitted through the substrate.

According to a fourth aspect of the invention, a luminaire is provided which comprises a color conversion arrangement according to any one of the previously discussed embodiments, or comprises a lighting unit according to any one of the previously discussed embodiments, or comprises a solid state light emitter package according to one of the previous embodiments. The luminaire according to the fourth aspect of the invention provides the same benefits as the color conversion arrangement, the lighting unit or the solid state light emitter package and has similar embodiments with similar effects as their corresponding embodiments.

Examples of solid state light emitters are Light Emitting Diodes (LEDs), Organic Light Emitting diode(s) OLEDs, or, for example, laser diodes. In some embodiments the solid state light source may be a blue light emitting LED, such as GaN or InGaN based LED, for example, emitting primary light of the wavelength range from 440 to 460 nm. Alternatively, the solid state light source may emit UV or violet light which is subsequently converted into light of longer wavelength(s) by one or more luminescent materials.

A fifth aspect of the invention relates to the use of a graphene layer which is thermally coupled to a luminescent layer as a means to reduce temperature differences in the luminescent layer, the luminescent layer comprises first luminescent material which is configured to absorb a portion of light of a first spectral distribution and is configured to convert a portion of the absorbed light towards light of a second spectral distribution. Advantages of such a use of a graphene layer have been discussed previously in the above discussed optional embodiments of the color conversion arrangement, the lighting unit and the solid state light emitter package.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the color conversion arrangement, the lighting unit and the solid state light emitter package, which correspond to the described modifications and variations of the color conversion arrangement, can be carried out by a person skilled in the art on the basis of the present description.

Figure 1A:
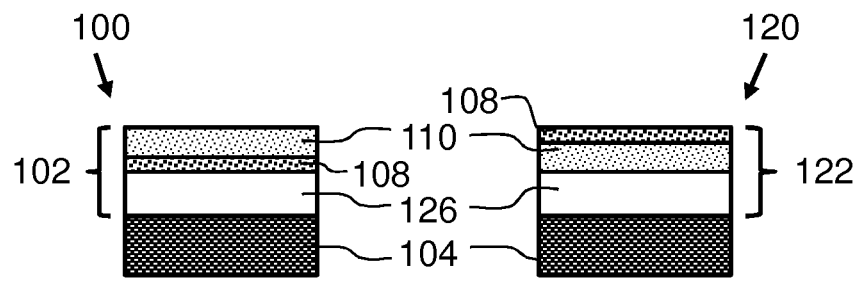
FIG. 1a schematically shows a cross-sectional view of two embodiments of a solid state light emitter package comprising a color conversion arrangement according to the first aspect of the invention, FIGS. 1b to 1d schematically show cross-sectional views of different embodiments of a color conversion arrangement according to the first aspect of the invention, FIG. 2 schematically shows a cross-sectional view of an embodiment of a lighting unit, FIG. 3a schematically shows a cross-sectional view of another embodiment of a lighting unit which comprises a heat sink, FIG. 3b schematically shows a cross-sectional view of a further embodiment of a lighting unit which comprises domed Light Emitter Diodes, FIGS. 4a to 4d schematically show cross-sectional views of alternative embodiments of a color conversion arrangement, and FIG. 5 schematically shows an embodiment of a luminaire.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION OF THE EMBODIMENTS

FIG. 1a schematically shows two embodiments of a solid state light emitter package 100, 120 comprising a color conversion arrangement 102, 122 according to the first aspect of the invention. Each solid state light emitter package 100, 120 comprises a Light Emitting Diode die 104. In other embodiments, the Light Emitting Diode die is a die of another type of other solid state light emitter, such as an Organic Light Emitting Diode or, for example, a laser diode. In operation, the Light Emitting Diode die 104 emits light of a first color. The Light Emitting Diode die 104 is provided on a light transmitting substrate 126. The light transmitting substrate 126 is also part of the color conversion arrangements 102, 122 and has the function of a supporting layer. The color conversion arrangements 102, 122 further comprise a graphene layer 108 and a luminescent layer 110. The graphene layer 108 and the luminescent layer 110 are in contact with each other. The luminescent layer 110 comprises a luminescent material which is configured to absorb a portion of light of a first spectral distribution comprising the first color and is configured to convert a portion of the absorbed light towards light of a second spectral distribution. This results in a light emission by the solid state light emitter package which comprises light of the second spectral distribution and, depending on the amount of light of the first color that has been absorbed, light of the first color. A first side of the substrate 126 is in contact with the Light Emitter Diode die 104, and a second side of the substrate 126, which is opposite the first side, is either in contact with the graphene layer 108 or with the luminescent layer 110. In other words, the solid state light emitter package 100 comprises a stack of layers and the layers of the stack of layers are, mentioned in an order from a first side of the package 100 to a second side of the package 100, the Light Emitting Diode die 104, the substrate 126, the graphene layer 108 and the luminescent layer 110. The solid state light emitter package 120 comprises a stack of layers and the layers of the stack of layers are, mentioned in an order from a first side of the package 120 to a second side of the package 120, the Light Emitting Diode die 104, the substrate 126, the luminescent layer 110 and the graphene layer 108.

Figure 1B:
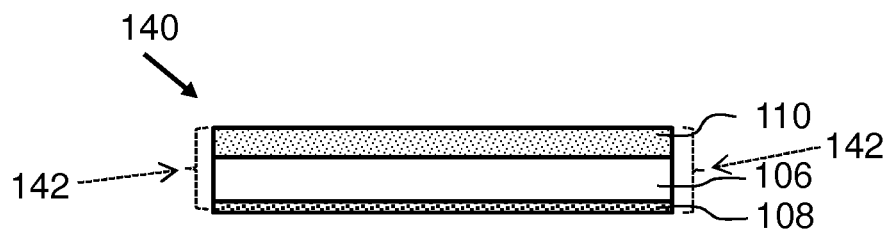

FIG. 1b schematically shows an embodiment of a color conversion arrangement 140 according to the first aspect of the invention. The color conversion arrangement 140 comprises a supporting layer 106 which is light transmitting, the graphene layer 108 which is arranged on a first surface of the supporting layer 106 and the luminescent layer 110 which is arranged on a second surface of the supporting layer 106. The second surface of the supporting layer 106 being opposite the first surface. The supporting layer 106 supports the layer of luminescent material 110 and/or the graphene layer 108. In other words, the supporting layer 106 is sandwiched in between the graphene layer 108 and the luminescent layer 110.

In FIG. 1b lateral side surfaces 142 of the color conversion arrangement 140 are configured to operate as a heat transfer interface, which means that the lateral side surface 142 are suitable for being thermally coupled to a heat sink such that heat can flow away from the color version arrangement 140 via the lateral side surfaces 142. The graphene layer 108 is at least thermal coupled to the heat transfer interface. In the specific embodiment of FIG. 1b, the graphene layer 108 ends at the lateral side surfaces 142 and, as such, it is thermally coupled to the location from where heat may be conducted away to a heat sink. It is to be noted that other embodiments of color conversion arrangement may also have a heat transfer interface from which, in operation, heat may be conducted away to a heat sink. It is further to be noted that the heat transfer interface may also be located at another location of the color conversion arrangement 140. For example, a portion of the surface of the graphene layer 108 which faces away from the supporting layer 106 may be the heat transfer interface when, in use, the graphene layer 108 is in contact with heat conducting layers of a lighting unit.

It is to be noted that the Figures present a cross-sectional view of the color conversion arrangement 140. The three dimensional shape of the color conversion arrangement 140 may be the shape of a thin/flat box or a disk. This also applies to subsequently presented embodiments of color conversion arrangements.

Figure 1C:
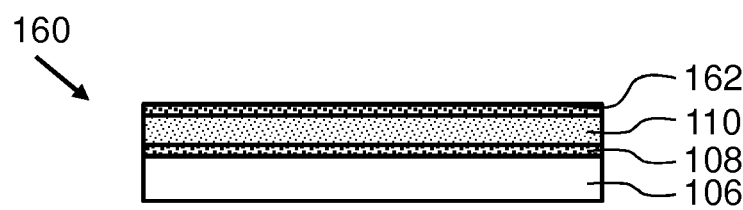

FIG. 1c schematically shows another embodiment of a color conversion arrangement 160 according to the first aspect of the invention. The color conversion arrangement 160 comprises the supporting layer 106 on which a stack of a first graphene layer 108, the luminescent layer 110 and a second graphene layer 162 is provided. The luminescent layer 110 of the stack of layers is sandwiched in between the first graphene layer 108 and the second graphene layer 162.

Figure 1D:
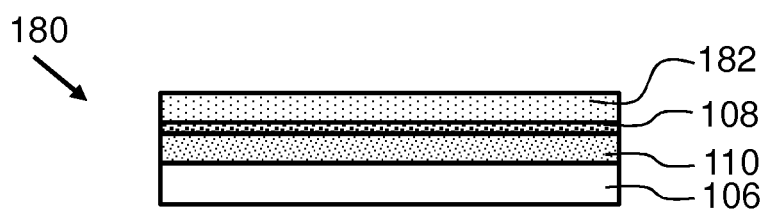

FIG. 1d schematically shows another embodiment of a color conversion arrangement 180 according to the first aspect of the invention. The color conversion arrangement 180 comprises the supporting layer 106 on which a stack of a first luminescent layer 110, a graphene layer 108 and a second luminescent layer 182 is provided. The graphene layer 108 is sandwiched in between the first luminescent layer 110 and the second luminescent layer 182. The first luminescent layer 108 comprises the luminescent material of which characteristics have been discussed before. The second luminescent material 182 comprises a second luminescent material which is configured to absorb a portion of light of a third spectral distribution comprising light of the first color (which light that is being received by the color conversion arrangement 180) and/or to absorb a portion of the light of the second spectral distribution (which is being emitted by the first luminescent layer 110) and the second luminescent material is configured to convert a portion of the absorbed light towards light of a fourth spectral distribution. In a specific embodiment the third spectral distribution is different from the first spectral distribution and in another embodiment they are equal. In another specific embodiment the fourth spectral distribution is equal to the second spectral distribution.

It is to be noted that in the embodiment of FIG. 1d two different luminescent materials are provided. In specific embodiments, the color conversion arrangement may comprise more than two luminescent materials. The additional luminescent materials may be provided in additional separate layers or may be provided in the same layer as the first luminescent material and/or the second luminescent material. In other presented embodiments of color conversion arrangements, one may also use such additional luminescent layers and/or use mixes of luminescent material.

The (first) graphene layer 108 and the optional second graphene layer 162 are made of a material which is indicated with the term "graphene". Graphene is a material which comprises a single layer of carbon atoms in an atomic scale honeycomb lattice, or which comprises 2 to 9 of such single layers of carbon atoms in an atomic scale honeycomb lattice. Above 9 layers of the carbons atoms in the honeycomb lattice, the characteristics of the material significantly changes and one speaks about the material "graphite". In the context of this invention, graphene must be thermally conductive and must be light transmitting (which means that a significant portion of light which impinges on the material is transmitted through the material) and, thus, graphene may have 1 to 9 layers of carbon atoms in an atomic scale honeycomb lattice.

Graphene is a good heat conductor and, when the graphene layer has a relatively small number of layers, it is almost transparent and, thus, transmits light very well. Thereby the graphene layers of the above discussed embodiments contribute to a better heat spreading within the color conversion arrangement. This results in a better operation of the luminescent material, and a longer life time of the luminescent material because it is not destroyed or deteriorated by too high temperatures.

The (first) luminescent layer 110 and/or the second luminescent layer 182 each comprises a luminescent material which is selected from the group of inorganic phosphors, organic phosphors and particles showing quantum confinement and having at least in one dimension a size in the nanometer range.

The inorganic luminescent material may comprises a yellow or yellow/green emitting inorganic phosphor, such as YAG and/or LuAG, or a red inorganic phosphor such as ECAS and/or BSSN.

Examples of inorganic phosphors suitable as luminescent materials include, but are not limited to, cerium doped yttrium aluminum garnet ($Y_3Al_5O_{12}:Ce^{3+}$, also referred to as YAG:Ce or Ce doped YAG) or lutetium aluminum garnet (LuAG, $Lu_3Al_5O_{12}$), $\alpha$-SiAlON:$Eu^{2+}$ (yellow), and $M_2Si_5N_8:Eu^{2+}$ (red) wherein M is at least one element selected from calcium Ca, Sr and Ba. Furthermore, a part of the aluminum may be substituted with gadolinium (Gd) or gallium (Ga), wherein more Gd results in a red shift of the yellow emission. Other suitable materials may include $(Sr_{1-x-y}Ba_xCa_y)_{2-z}Si_{5-a}Al_aN_{8-a}O_a:Eu_z^{2+}$ wherein $0 \le a < 5$, $0 \le x \le 1$, $0 \le y \le 1$ and $0 < z \le 1$, and $(x+y) \le 1$, such as $Sr_2Si_5N_8:Eu^{2+}$ which emits light in the red range.

Particles of inorganic phosphors may be dispersed in a matrix polymer, such as, for example, Polymethyl methacrylate (PMMA), Polyethylene terephthalate (PET), Polyethylene naphthalate (PEN) or polycarbonate (PC). The inorganic phosphors may also be dispersed in Silicone or other epoxies and/or resins. In other embodiments, an inorganic phosphor forms the basis of a ceramic luminescent layer.

Organic phosphors have a high quantum efficiency and are often transparent, which prevents undesired scattering and increases efficiency. Organic luminescent materials have more advantages. The position and the bandwidth of the luminescence spectrum can be designed with ease to be anywhere in the visible range. As such it is relatively easy to manufacture a light source which emits white light with high efficacy. The white light may be a combination of at least two colors of light, and thus the light source may comprise a single light emitter that emits light of a first color and comprise at least one organic luminescent material that converts a part of the light of the first color into a light of a second color.

The organic phosphor may be a material which comprises a perylene derivative, such as a yellow emitting perylene derivative, or a red/orange emitting perylene derivative. Such perylene derivatives are commercially available under the name Lumogen Yellow F083 or F170, Lumogen Red F305 and Lumogen Orange F240.

There is a nearly unlimited assortment of such organic luminescent materials or dyes. Relevant examples are perylenes (such as dyes known under their trade name Lumogen from the company BASF, Ludwigshafen, Germany: Lumogen F240 Orange, Lumogen F300 Red Lumogen F305 Red, Lumogen F083 Yellow, Lumogen F170 Yellow, Lumogen F850 Green), Yellow 172 from the company Neelikon Food Dyes & Chemical Ltd., Mumbai, India, and dyes such as coumarins (for example Coumarin 6, Coumarin 7, Coumarin 30, Coumarin 153, Basic Yellow 51), napthalimides (for example Solvent Yellow 11, Solvent Yellow 116), Fluorol 7GA, pyridines (for example pyridine 1), pyrromethenes (such as Pyrromethene 546, Pyrromethene 567), uranine, rhodamines (for example Rhodamine 110, Rhodamine B, Rhodamine 6G, Rhodamine 3B, Rhodamine 101, Sulphorhodamine 101, Sulphorhodamine 640, Basic Violet 11, Basic Red 2), cyanines (for example phthalocyanine, DCM), stilbenes (for example Bis-MSB, DPS), available from many traders. Several other dyes, such as acid dyes, basic dyes, direct dyes and dispersion dyes may be used as long as they show a sufficiently high fluorescence quantum yield for the intended use. Hence, one or more of the luminescent moieties may comprise perylene groups. Especially, one or more luminescent moieties are configured to generate red luminescence upon excitation by blue and/or UV light.

Molecules of organic phosphors may be dissolved in a matrix polymer, such as, for example, Polymethyl methacrylate (PMMA), Polyethylene terephthalate (PET), Polyethylene naphthalate (PEN) or polycarbonate (PC). The molecules of organic phosphor may also be dissolved in Silicone or in epoxies or resins.

Particles showing quantum confinement and having at least in one dimension a size in the nanometer range are, for example, quantum dots, quantum rods or quantum tetrapods. Having a size in one dimension in the nanometer range means that, for example, if the particles are substantially spherical, their diameter is in the nanometer range. Or, this means, for example, if they are wire-shaped, that a size of a cross-section of the wire is in one direction in the nanometer range. A size in the nanometer range means that their size is at least smaller than 1 micrometer, thus, smaller than 500 nanometers, and larger or equal to 0.5 nanometer. In an embodiment, the size in one dimension is smaller than 50 nanometers. In another embodiment the size in one dimension is in the range from 2 to 30 nanometers. Quantum dots are small crystals of semiconducting material generally having a width or diameter of only a few nanometers. When excited by incident light, a quantum dot emits light of a color determined by the size and material of the crystal. Light of a particular color can, therefore, be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore, the emission color can easily be tuned by adapting the size of the quantum dots. Any type of quantum dot known in the art may be used in the present invention, provided that it has the appropriate wavelength conversion characteristics.

A combination of different luminescent materials may be used to improve the color rendering index (CRI) of the light emitted by the color conversion arrangements. Multilayer stacks of luminescent materials may be used or different luminescent materials may be mixed in a single layer. A graphene layer can be sued to spread heat between layers of a stack of layers. Furthermore, in an alternative arrangement of the luminescent layers, the layers comprise different materials which are separated in space, such as in, for example, a pixelated luminescent layer.

It is well-known to the skilled person how to manufacture layers of luminescent materials and how to apply them on other layers, such as, for example, the supporting layer. The application of graphene layers on a relatively large area is, for example, described in the article of X. Li et al, "Transfer of large-area graphene films for high-performance transparent conductive electrodes", published in Nano Lett. 2009, 9 (12), pp 4359-4363 and published by the American Chemical Society.

Figure 2:
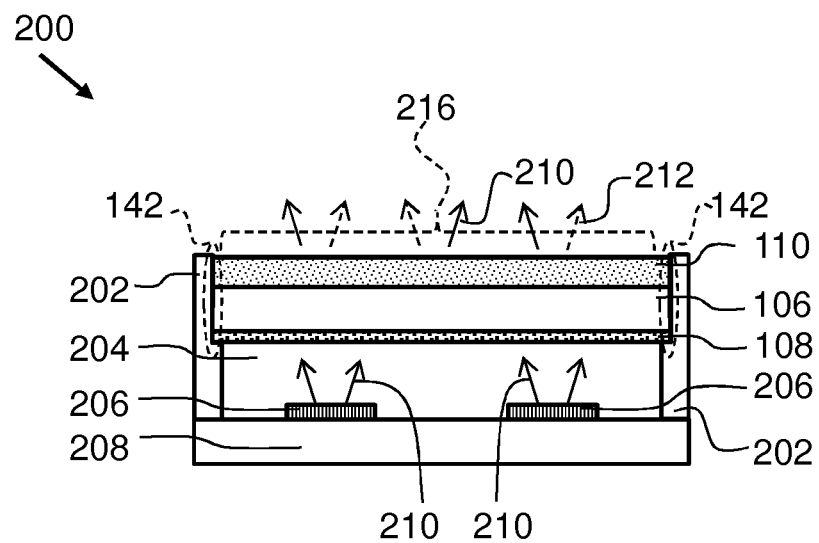

FIG. 2 schematically shows an embodiment of a lighting unit 200. The lighting unit comprises a housing, two solid state light emitters 206 and the color conversion arrangement of FIG. 1*b*. The housing comprises a base 208 and walls 202, the walls 202 and base 208 enclose a cavity 204. The housing further comprises a light exit window 216. The color conversion arrangement of FIG. 1*b* is provided at the light exit window 216. At least a portion of the housing is made of heat conductive material. In the example of FIG. 2 at least the walls 202 are made of a heat conductive material, such as, for example, a metal. The base 208 may be made of the same material. The color conversion arrangement comprises a graphene layer 108, a supporting layer 106 and a luminescent layer 110. The lateral side ends 142 of the color conversion arrangement are thermally coupled to the walls 202 of the heat conductive material such that heat can be transported away from the color conversion arrangement thereby reducing the temperature of the color conversion arrangement. Two solid state light emitters 206 which emit light 210 of a first color towards the color conversion arrangement are provided within the cavity 204 on the base 208. The solid state light emitters 206 are, for example, Light Emitting Diodes. In an optional embodiment, the solid state light emitters 206 are thermally coupled to the base 208 such that heat generated in the solid state light emitters 206 may be conducted away from them. The light 210 of the first color is transmitted through the graphene layer 108, through the supporting layer 106 and is at least partly absorbed by the luminescent material of the luminescent layer 110. The luminescent material converts at least a portion of the absorbed light towards light 212 of a specific distribution. As shown in FIG. 2, the light which is emitted through the light exit window 216 comprises light 210 of the first color and light 212 of the specific spectral distribution. Depending on the (relative) amount of light 210 of the first color which is absorbed by the luminescent material, specific colors of light may be emitted by the lighting unit 200 wherein the specific colors may be obtained by mixing light 210 of the first color and light 212 of the specific spectral distribution. How much light 210 of the first color is being absorbed depends, for example, on the specific luminescent material, the amount of luminescent material used in the luminescent layer 110 and the thickness of the luminescent layer 110.

In the lighting unit 200, heat is locally generated in the luminescent layer 110. The graphene layer 108 is thermally coupled to the luminescent layer 110 via the supporting layer 106. Graphene is a good heat conductor and heat received by the graphene layer 108 is conducted into a lateral direction such that the heat is better distributed within the color conversion arrangement and the maximum temperature within the luminescent layer 110 is reduced. The graphene layer 108 is also thermally coupled to the walls 202 of the lighting unit 200 such that heat being generated in the color conversion arrangement can be conducted towards the housing of the lighting unit 200 such that the maximum temperature of the luminescent layer 110 is further reduced.

It is to be noted that FIG. 2 presents a cross-sectional view of the lighting unit 200. The three-dimensional shape of the lighting unit 200 may, thus, be a box shape, or a cylindrical shape. Furthermore, the cross-sectional view shows two solid state light emitters 206, but more than two solid state light emitters 206 may be present in the cavity. In another optional embodiment, the lighting unit 200 comprises a single solid state light emitter 206. Other embodiments of lighting units, which are, for example, presented in FIGS. 3*a* and 3*b*, may also have a shape in accordance with the above discussed embodiments and may also comprise one or more solid state light emitters.

The cavity 204 is filled with a gas, such as, for example, air. In another embodiment of the lighting unit 200, a light transmitting resin is provided within the cavity and is optically coupled to the solid state light emitters 206 and the color conversion arrangement.

Figure 3A:
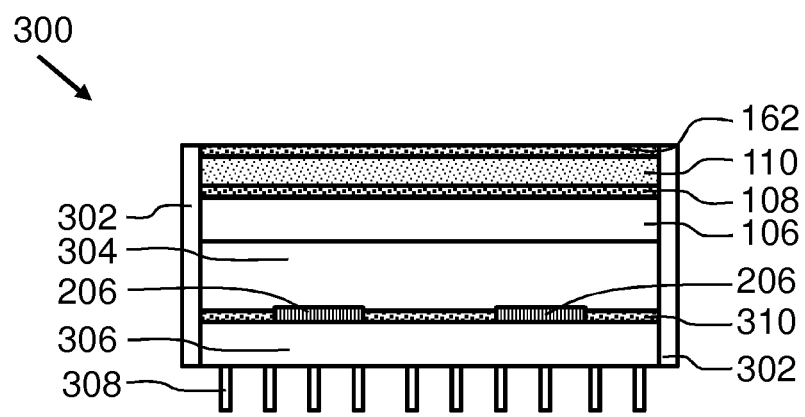

FIG. 3*a* schematically shows another embodiment of a lighting unit 300 which comprises a heat sink 308. The lighting unit 300 comprises the color conversion arrangement of FIG. 1*c* and the color conversion arrangement is provided at a light exit window of a housing of the lighting unit 300. The housing comprises heat conductive walls 302 and a heat conductive base 306 which enclose a cavity 304. The color conversion arrangement is thermally coupled to the heat conductive walls 302 and more in particular, the first graphene layer 108 and the second graphene layer 162 of the color conversion arrangement are thermally coupled to the heat conductive walls 302 such that heat generated within the luminescent layer 110 may be conducted away from the color conversion arrangement towards the heat sink 308. At a surface of the base which faces away from the cavity 304, the heat sink 308 is provided which comprises, for example, fins. Other characteristics of the color conversion arrangement are similar to characteristics of the lighting unit 200 of FIG. 2. It is to be noted that the presented embodiment of the lighting unit 300 is not limited to the color conversion arrangement of FIG. 1*c*. Other color conversion arrangements may also be provided at the light exit window.

Optionally, in addition to the graphene layers 108, 162 provided in the color conversion arrangement, the lighting unit 300 may comprise an additional graphene layer 310 which is provided within the cavity 304 which is thermally coupled to the light emitters 206 and which is thermally coupled to a heat conductive portion of the housing. In the example of FIG. 3*a*, the additional graphene layer 310 is provided on the heat conductive base 306 and is in contact with the solid state light emitters 206 and in contact with the base 306. Thereby the graphene layer 310 assists in the spreading of heat originating from the solid state light emitters 206 towards other parts of the light unit 300, such as, in the example of FIG. 3*a*, the heat sink 308. It is to be noted that other embodiments of lighting units, such as for example presented in FIG. 2 and FIG. 3*b*, may also comprise one or more additional graphene layers within the cavity for providing additional heat spreading and conduction within the lighting unit. In FIG. 3*a* the additional graphene layer 310 is only drawn as a layer which is provided on the base 306 and is not applied on top of the solid state light emitters 206. However, in an alternative embodiment, the additional graphene layer 310 is also provided on top of the solid state light emitters 206 such that a better thermal contact is made.

Figure 3B:
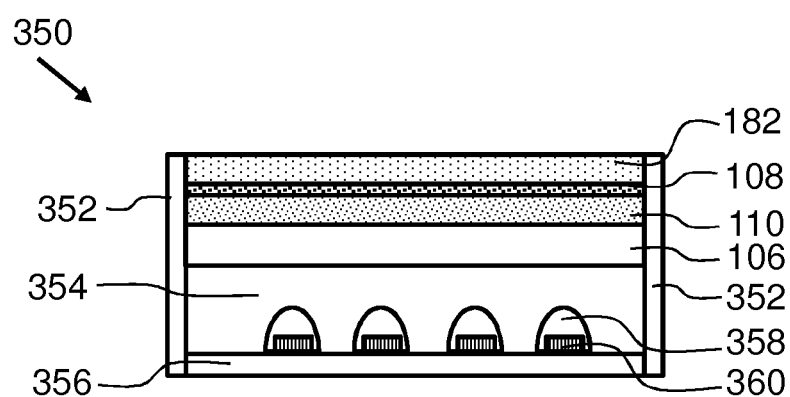

FIG. 3*b* schematically shows a further embodiment of a lighting unit 350 which comprises domed Light Emitter Diodes 358/360. The lighting unit 350 is similar to previously discussed lighting units. In the specific example of the lighting unit 350 of FIG. 3*b* the color conversion arrangement of FIG. 1*d* has been provided at the light exit window of the housing of the lighting unit 350. The housing of the lighting unit 350 comprises a housing of heat conductive walls 352 and a heat conductive base 356. The color conversion arrangement is thermally coupled to the heat conductive walls 352. The housing encloses a cavity 354 which is filled with air. Within the cavity 354, on a surface of the base 356, are provided Light Emitting Diodes 360 which are provided with a dome 358 which refracts light emitted by its corresponding Light Emitting Diode 360 into a predefined light beam. The dome 358 may have a function similar to a lens, but is at least used to improve the outcoupling of light from the Light Emitting Diode 360 die.

Figure 4A:
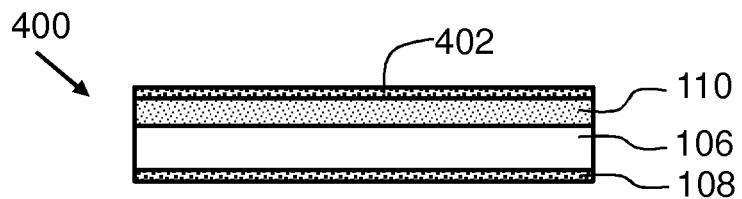

FIGS. 4a to 4d schematically show cross-sectional views of alternative embodiments of a color conversion arrangement. FIG. 4a presents a color conversion arrangement 400 which is similar to color conversion arrangement 140 of FIG. 1b and which comprises an additional second graphene layer 402. The second graphene layer 402 is provided on a side of the luminescent layer 110 which is opposite the side at which the luminescent layer 110 is in contact with the supporting layer 106. Thus, seen in a direction perpendicular to the plane of the color conversion arrangement 400, the color conversion arrangement 400 is build up from the layers: the first graphene layer 108, a supporting layer 106, a luminescent layer 110 and the second graphene layer 110.

Figure 4B:
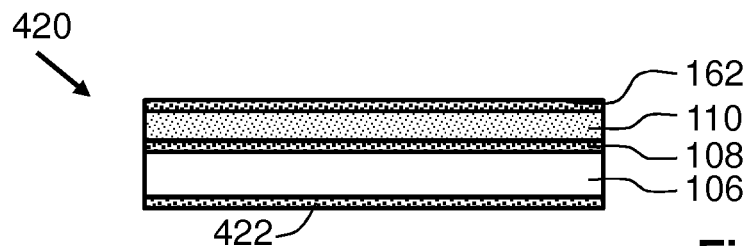

FIG. 4b presents a color conversion arrangement 420 which is similar to color conversion arrangement 160 of FIG. 1c. An additional third graphene layer 422 is provided which at a surface of the supporting layer 106 which is opposite the surface of the supporting layer 106 at which the stack of the first graphene layer 108, the first luminescent layer 110 and the second graphene layer 162 is provided. Thus, seen in a direction perpendicular to the plane of the color conversion arrangement 420, the color conversion arrangement 420 is build up from the layers: the third graphene layer 422, the supporting layer 106, the first graphene layer 108, the luminescent layer 110 and the second graphene layer 162.

Figure 4C:
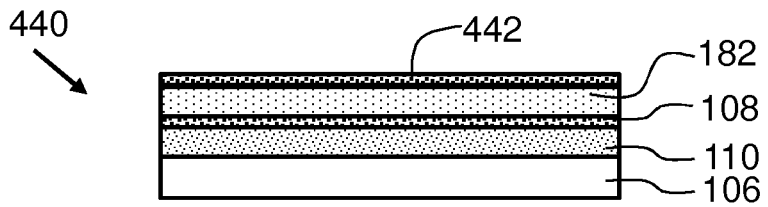

FIG. 4c presents a color conversion arrangement 440 which is similar to color conversion arrangement 180 of FIG. 1d. An additional second graphene layer 442 is provided to a surface of the second luminescent layer 182 which is opposite the surface of the second luminescent layer 182 that is in contact with the first graphene layer 108. Thus, seen in a direction perpendicular to the plane of the color conversion arrangement 440, the color conversion arrangement 440 is build up from the layers: the supporting layer 106, the first luminescent layer 110, the first graphene layer 108, the second luminescent layer 182 and the second graphene layer 442.

Figure 4D:
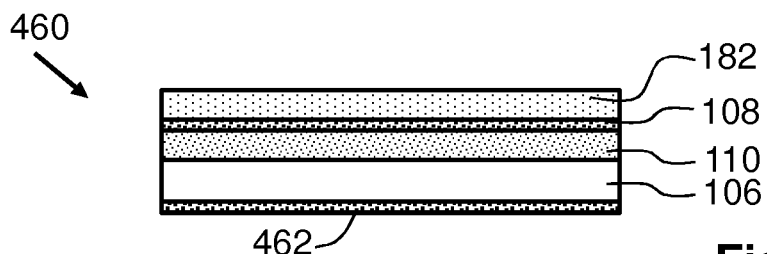

FIG. 4d presents a color conversion arrangement 460 which is similar to color conversion arrangement 180 of FIG. 1d. An additional second graphene layer 462 is provided to a surface of the supporting layer 106 which is opposite the surface of the supporting layer 106 that is in contact with the first luminescent layer 110. Thus, seen in a direction perpendicular to the plane of the color conversion arrangement 460, the color conversion arrangement 460 is build up from the layers: the second graphene layer 462, the supporting layer 106, the first luminescent layer 110, the first graphene layer 108 and the second luminescent layer 182.

Figure 5:
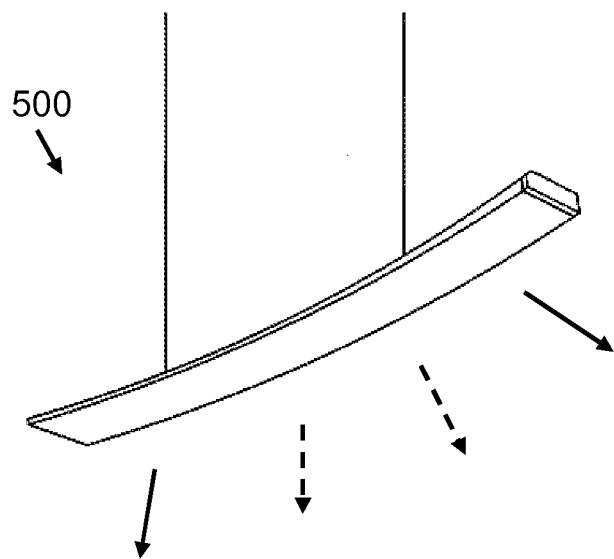

FIG. 5 schematically shows an embodiment of a luminaire 500. The luminaire 500 comprises at least one color conversion arrangement as disclosed in the context of FIGS. 1a to 1d or FIGS. 4a to 4d, and/or which comprises at least one lighting unit as disclosed in the context of FIG. 2 or FIGS. 3a and 3b.

Summarized, the current application provided a color conversion arrangement, a lighting unit, a solid state light emitter package, a luminaire and a specific use of a graphene layer. A color conversion arrangement with the first aspect comprises a first luminescent layer, a supporting layer and a first graphene layer. The color conversion arrangement is for converting light of a first color to light of another color. The first luminescent layer comprises a first luminescent material which absorbs a portion of light of a first spectral distribution comprising the first color and converts at least a portion of the absorbed light towards light of a second spectral distribution. The supporting layer supports the luminescent layer. The first graphene layer thermally conducts heat in a lateral direction such that temperature differences in the color conversion arrangement are reduced. Different arrangements of the layers of the color conversion arrangement are provided.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A lighting unit comprising:
   a housing enclosing a cavity and comprising a light exit window, wherein at least a portion of the housing comprising a heat conductive material;
   a light emitter disposed in the cavity and configured to emit light of a first color;
   a color conversion arrangement disposed within the housing above the cavity and configured to convert the light of the first color to light of another color, the color conversion arrangement comprising: (i) a first luminescent layer comprising a first luminescent material configured to absorb a portion of light of a first spectral distribution comprising the first color and configured to convert at least a portion of the absorbed light towards light of a second spectral distribution; (ii) a supporting layer configured to support the first luminescent layer; and (iii) a first graphene layer configured to thermally conduct heat in a lateral direction to reduce temperature differences in the color conversion arrangement, wherein:
   i) the supporting layer is formed by a layer of the light emitter, wherein a stack of the first luminescent layer and the first graphene layer is provided on the supporting layer, and wherein a light emitting surface of the supporting layer is in contact with either the first luminescent layer or the first graphene layer; or
   ii) the supporting layer comprises a first side and a second side being opposite the first side, and the first graphene layer is provided at the first side of the supporting layer, wherein the first graphene layer is thermally coupled to the supporting layer, and the first luminescent layer is provided at the second side of the supporting layer, and further wherein the first luminescent layer is thermally coupled to the supporting layer; or
   iii) the color conversion arrangement comprises a second graphene layer, and the first luminescent layer is sandwiched between the first graphene layer and the second graphene layer, and wherein a stack of the first and second graphene layers and first luminescent layer is provided on the supporting layer; or iv) the color conversion arrangement comprises a second luminescent layer comprising a second luminescent material configured to absorb a portion of light of a third spectral distribution comprising the first color and/or light of the second spectral distribution, wherein the second luminescent material is configured to convert at least a portion of the absorbed light towards light of a fourth spectral distribution, and wherein the first graphene layer is sandwiched between the first luminescent layer and the second luminescent layer and a stack of the luminescent layers and the first graphene layer is provided on the supporting layer; and wherein the color conversion arrangement is provided at the light exit window, and the first graphene layer and/or the second graphene layer is thermally coupled to the portion of the housing of the heat conductive material.

2. A lighting unit according to claim 1, wherein the color conversion arrangement further comprises a heat transfer interface thermally coupled to a heat sink, wherein the first graphene layer and optionally the second graphene layer are thermally coupled to the heat transfer interface.

3. A lighting unit according to claim 2, wherein the heat transfer interface is in contact with the portion of the housing of the heat conductive material.

4. A lighting unit according to claim 1, wherein the first luminescent material and optionally the second luminescent material comprise at least a luminescent material selected from the group of inorganic phosphors, organic phosphors and particles showing quantum confinement and having at least in one dimension a size in the nanometer range.

5. A lighting unit according to claim 1, wherein the color conversion arrangement further comprises:

third second graphene layer provided on an opposite surface of the supporting layer;

wherein the opposite surface of the supporting layer is opposite a surface on which one of the respective stacks is provided, if: (i) the color conversion arrangement comprises the second graphene layer and the first luminescent layer is sandwiched between the first graphene layer and the second graphene layer and a stack of the graphene layers and first luminescent layer is provided on the supporting layer; or (ii) the color conversion arrangement comprises the second luminescent layer comprising the second luminescent material, the first graphene layer is sandwiched between the first luminescent layer and the second luminescent layer and the stack of the luminescent layers and the first graphene layer is provided on the supporting layer and wherein the color conversion arrangement being provided at the light exit window, the first graphene layer and/or a third graphene being thermally coupled to the portion of the housing of the heat conductive material.

6. A lighting unit according to claim 1, wherein the color conversion arrangement comprises a third second graphene layer provided, respectively, on a surface of the first luminescent layer or on a surface of the second luminescent layer which is facing away from the supporting layer, if: (i) the supporting layer comprises the first side and the second side is opposite the first side, wherein the first graphene layer is provided at the first side of the supporting layer and the first graphene layer is thermally coupled to the supporting layer, and wherein the first luminescent layer is provided at the second side of the supporting layer; or if (ii) the color conversion arrangement comprises the second luminescent layer comprising the second luminescent material, the first graphene layer is sandwiched between the first luminescent layer and the second luminescent layer and the stack of the luminescent layers and the first graphene layer is provided on the supporting layer;

wherein the color conversion arrangement is provided at the light exit window, and the first graphene layer and/or the further second graphene layer is thermally coupled to the portion of the housing of the heat conductive material.

7. A lighting unit according to claim 6, further comprising an additional graphene layer being arranged at a surface of the housing, the surface facing the cavity, and the additional graphene layer being thermally coupled to the light emitter and/or to the portion of the housing of the heat conductive material.

8. A lighting unit according to claim 6, further comprising a heat sink, wherein the portion of the housing of the heat conductive material is thermally coupled to the heat sink.

9. A solid state light emitter package comprising:

a solid state light emitter die of a solid state light emitter;

a color conversion arrangement according to claim 6, wherein the supporting layer is a layer of the solid state light emitter or is a substrate on which the solid state light emitter die is provided.

10. A luminaire comprising a lighting unit according to claim 1.

11. A color conversion arrangement for converting light of a first color to light of another color, the color conversion arrangement comprising:

a first luminescent layer comprising a first luminescent material configured to absorb a portion of light of a first spectral distribution comprising the first color and configured to convert at least a portion of the absorbed light towards light of a second spectral distribution;

a supporting layer configured to support the first luminescent layer; and a first graphene layer configured to thermally conduct heat in a lateral direction to reduce temperature differences in the color conversion arrangement;

wherein the supporting layer comprises a first side and a second side opposite the first side, wherein the first graphene layer is provided at the first side of the supporting layer and the first graphene layer is thermally coupled to the supporting layer, and wherein the first luminescent layer is provided at the second side of the supporting layer and the first luminescent layer is thermally coupled to the supporting layer;

wherein the color conversion arrangement is configured to be positioned within a housing above a lighting element.

12. The color conversion arrangement of claim 11, further comprising a second luminescent layer comprising a second luminescent material configured to absorb a portion of light of a third spectral distribution comprising the first color and/or light of the second spectral distribution and configured to convert at least a portion of the absorbed light towards light of a fourth spectral distribution, wherein the first graphene layer is sandwiched between the first luminescent layer and the second luminescent layer and a stack of luminescent layers and the first graphene layer is provided on the supporting layer.

* * * * *